(12) United States Patent
Fu

(10) Patent No.: US 7,719,335 B2
(45) Date of Patent: May 18, 2010

(54) SELF-BIASED PHASE LOCKED LOOP AND PHASE LOCKING METHOD

(75) Inventor: Zhigang Fu, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 12/189,085

(22) Filed: Aug. 8, 2008

(65) Prior Publication Data
US 2009/0273379 A1 Nov. 5, 2009

(30) Foreign Application Priority Data
May 4, 2008 (CN) .......................... 2008 1 0037055

(51) Int. Cl.
*H03L 7/06* (2006.01)
(52) U.S. Cl. ....................... 327/158; 327/147; 327/156; 331/16
(58) Field of Classification Search ................ 327/147, 327/156; 331/1 A, 16, 17
See application file for complete search history.

(56) References Cited
U.S. PATENT DOCUMENTS 7,078,977 B2 * 7/2006 Maneatis ..................... 331/16
7,310,020 B2 * 12/2007 Tan et al. ..................... 331/16
7,443,761 B2 * 10/2008 Lin .......................... 365/233.1
7,466,174 B2 * 12/2008 Tirumalai et al. ........... 327/156
2008/0150596 A1 * 6/2008 Fayneh et al. ............... 327/157

* cited by examiner

*Primary Examiner*—Lincoln Donovan
*Assistant Examiner*—Adam D Houston
(74) *Attorney, Agent, or Firm*—Squire, Sanders & Dempsey, L.L.P.

(57) ABSTRACT

The present invention discloses a self-bias phase locked loop including a phase frequency detector, a charge pump, a loop filter, a voltage control oscillator, a divider and a bias current converter. A charging or discharging current output from the charge pump equals to a first control current. A resistor of the loop filter is controlled by a first control voltage a second control voltage which is adjusted according to the first control voltage and a second control current. The loop filter boosts or lowers the first control voltage according to the charging or discharging current output from the charge pump. The voltage control oscillator generates a bias current according to the first control voltage and increases or decreases an oscillation frequency according to the boosted or lowered first control voltage, and symmetric loads of the voltage control oscillator are controlled by the first control voltage. The first control current output from the bias current converter equals to the ratio of the bias current to a constant, and the second control current output from the bias current converter equals to the ratio of the bias current to a frequency division factor. The circuit of the self-bias phase locked loop is simple and a low jitter.

6 Claims, 4 Drawing Sheets

SELF-BIASED PHASE LOCKED LOOP AND PHASE LOCKING METHOD

CROSS-REFERENCE TO RELATED APPLICATION

This application is related to a U.S. application Ser. No. 12/336,428, assigned to the same assignee as this application.

This application claims the priority of Chinese Patent Application No. 200810037055.4, filed May 4, 2008, the entire disclosure of which is incorporated herein by reference.

FIELD OF THE INVENTION

The present invention relates to the field of phase looked loop, and in particular to a self-biased phase locked loop and a phase locking method.

BACKGROUND OF THE INVENTION

A Phase Locked Loop (PLL) is widely applied in a System on Chip (SOC) to constitute a frequency synthesizer, a clock generator and the like. FIG. 1 is a basic structure of a PLL, in which a Phase Frequency Detector (PFD) 10 detects a frequency difference and a phase difference between an input signal $F_{ref}$ and a feedback signal $F_{fb}$, and generates pulse control signals UP and DN and sends them to a Charge Pump (CP) 20. In the CP 20, the pulse control signals UP and DN are converted into a current $I_p$ so as to charge or discharge a capacitor $C_p$ of a Loop Filter (LP) 30, the LP 30 generates and sends a control voltage $V_{ctrl}$ to a Voltage Control Oscillator (VCO) 40. The VCO 40 increases an oscillation frequency as the control voltage $V_{ctrl}$ is boosted, and the VCO 40 decreases the oscillation frequency as the control voltage $V_{ctrl}$ is dropped. An output signal $F_{out}$ of the VCO 40 results in the feedback signal $F_{fb}$ via a divider 50, so that the entire system forms a feedback system, and the frequency and phase of the output signal $F_{out}$ are locked to a fixed frequency and phase.

A loop damping factor $\xi$ of the PLL illustrated in FIG. 1 is denoted by Equation (1) and a loop bandwidth $\omega_n$ is denoted by Equation (2):

$$\xi = \frac{R_p}{2}\sqrt{\frac{I_p K_v C_p}{N}} \quad (1)$$

$$\omega_n = \sqrt{\frac{K_v I_p}{N C_p}} \quad (2)$$

where $C_p$ denotes the capacitor of the LF 30, $R_p$ denotes a resistor of the LF 30, $I_p$ denotes a current for charging or discharging the capacitor $C_p$ (that is, the charging or discharging current output from the CP 20), $K_v$ denotes a gain of the VCO 40, and N denotes a frequency division factor of the divider 50.

A high performance phase looked loop should have advantages as follows: insusceptibility to variations of process, voltage and temperature (PVT), a wide frequency band, a low phase jitter and a small frequency change after being locked, a monolithic integrated filter, low power consumption for circuit and the like. However, it may be difficult to design a phase looked loop satisfying all the requirements. A typical phase looked loop based on a VCO has a phase jitter caused by the noise of a power source and a substrate. The loop acts as a low-pass filter for the noise, and the narrower the loop bandwidth is, the lower the jitter will be. On the other hand, the capacitor of the filter can not be manufactured largely in size due to the requirement of monolithic integration, and at the same time, the bandwidth may be restricted by the loop stability condition. These restrictive conditions may result in the designed PLL with a narrow operation frequency band and poor jitter performance.

A method for improving a bandwidth and lowering a jitter is to vary the bandwidth of the PLL to follow the operation frequency of the PLL. The loop has a narrow bandwidth and a low jitter in each operation status, but the varying bandwidth of the PLL may result in a very wide frequency range while reducing phase and frequency jitters introduced by the noise. An example of the method is a self-biased method to design a PLL with a loop damping factor $\xi$ of a fixed value (typically 1). The damping factor $\xi$ and the ratio of the loop width $\omega_n$ to an angular frequency of an input signal $\omega_{ref}$ (hereinafter, referred to as an input frequency, $\omega_{ref}=2\pi F_{ref}$, where $F_{ref}$ denotes a frequency of the input signal) are determined only by a relative value of a capacitor during a fabrication process.

The technical document titled "Low-Jitter Process-Independent DLL and PLL Based on Self-Biased Techniques" (John G Maneatis, *IEEE Journal OF Solid-State Circuits*, VOL. 31, NO. 11, NOVEMBER 1996) discloses a basic structure of a self-biased PLL. As illustrated in FIG. 2, a capacitor $C_1$ and a bias generator 60 constitute a LF 31, that is, the bias generator 60 creates a resistor of the LF 31, and a current output from an additional CP 21 is applied at the output terminal of a bias voltage $V_{BP}$ of the bias generator 60, so that a CP 20 charges and discharges the capacitor $C_1$ and the CP 21 charges and discharges the resistor created by the bias generator 60.

The bias generator 60 generates bias voltages $V_{BP}$ and $V_{PN}$ from a control voltage $V_{CTRL}$ to provide input voltages to a VCO 41. As illustrated in FIG. 3, the bias generator 60 includes a bias initialization circuit 601, an amplifier bias circuit 602, a differential amplifier circuit 603, a half-buffer replication circuit 604 and a control voltage buffer circuit 605. The amplifier bias circuit 602 provides the differential amplifier circuit 603 with a bias, and the differential amplifier circuit 603 adjusts the bias voltage $V_{BN}$, so that the half-buffer replication circuit 604 and the control voltage buffer circuit 605 replicate the control voltage $V_{CTRL}$ to the bias voltage $V_{BP}$ at the output terminal, that is, $V_{BP}=V_{CTRL}$.

The VCO 40 of the basic PLL illustrated in FIG. 1 typically includes a plurality of buffer stages with a differential structure, and the VCO 41 of the self-biased PLL illustrated in FIG. 2 includes n (n≧2) differential buffer delay stages with symmetric loads, for example, the VCO 41 including three differential buffer delay stages 410 with symmetric loads as illustrated in FIG. 4. The bias voltage $V_{BN}$ provides the loads 411 and 412 with a bias current $2I_D$ ($I_D$ denotes a current flowing through the symmetric load 411 or 412). The bias voltage $V_{BP}$ of the symmetric loads 411 and 412 equals to the control voltage $V_{CTRL}$, and an equivalent resistance of the symmetric loads 411 and 412 equals to $\frac{1}{2}g_m$, where $g_m$ denotes a transconductance of one transistor in the symmetric loads. A resistance of the symmetric loads 411 and 412, a time delay of the buffer stages and a frequency of the output signal (CK+ or CK−) of the VCO 41 vary with the control voltage $V_{CTRL}$.

It is assumed that the current $I_p$ of the CPs 20 and 21 x times the bias current $2I_D$ of the VCO 41, that is, $I_p=x \cdot 2I_D$, and the resistance $R_p$ of the LF 31 created by the symmetric load 606 in the bias generator 60 y times an equivalent resistance $R_o$ of the buffer stages 410 of the VCO 41, that is, $R_p=yR_o=y/2g_m$. Therefore, a loop damping factor $\xi$ of the self-biased PLL illustrated in FIG. 2 is denoted by Equation (3) and the ratio of an loop bandwidth $\omega_n$ to an input frequency $\omega_{ref}$ is denoted by Equation (4):

$$\xi = \frac{y}{4}\sqrt{\frac{x}{N}}\sqrt{\frac{C_1}{C_B}} \quad (3)$$

$$\frac{\omega_n}{\omega_{ref}} = \frac{xN}{2\pi}\sqrt{\frac{C_B}{C_1}} \quad (4)$$

where $C_B$ denotes a parasitic capacitor of the VCO 41. Thus, parameters x and y and the frequency division factor N meet certain ratio relationship by designing a circuit so as to counteract the frequency division factor N, so that the damping factor $\xi$ of the PLL and the ratio $\omega_n/\omega_{ref}$ of the loop bandwidth to the input frequency are determined only by a relative value of the capacitors $C_B$ and $C_1$ in a fabrication process.

Two CPs are typically used in most of existing self-biased PLLs to charge or discharge a capacitor and a resistor respectively, for example, as mentioned in the U.S. patents No. US20020067214, No. US20060267646 and No. US20070152760, which is more one CP than the basic PLL so that the circuit may be relatively complex.

SUMMARY OF THE INVENTION

An object of the present invention is to provide a self-biased Phase Locked Loop (PLL) with simple structure to simplify a circuit.

In order to achieve the object, the present invention provides a self-biased PLL including:

a Phase Frequency Detector (PFD) adapted to detect a frequency difference and a phrase difference between an input signal and a feedback signal and generate a pulse control signal;

a Charge Pump (CP) adapted to generate a charging or discharging current which equals to a first control current input to the CP according to the pulse control signal output from the PFD;

a Loop Filter (LF) including a filter unit adapted to output a first control voltage, to boost the first control voltage at two terminals of the filter unit when the CP outputs the charging current, and to lower the first control voltage at the two terminals of the filter unit when the CP outputs the discharging current, wherein the filter unit includes a resistor controlled by the first control voltage and a second control voltage, and the second control voltage is adjusted by the first control voltage and a second control current which is input to the LF;

a Voltage Control Oscillator (VCO) including an oscillation unit with symmetric loads controlled by the first control voltage, and adapted to increase an oscillation frequency of an output signal when the first control voltage is boosted, decrease the oscillation frequency of the output signal when the first control voltage is lowered, and generate a bias current and a bias voltage which is provided to the oscillation unit according to the first control voltage output from the LF;

a divider adapted to perform frequency division on the output signal of the VCO and generate the feedback signal input to the PFD; and a bias current converter adapted to convert the bias current generated by the VCO into the first control current input to the CP and the second control current input to the LF, wherein the first control current equals to the ratio of the bias current to a constant, and the second control current equals to the ratio of the bias current to a frequency division factor of the divider.

Optionally, the LF further includes a filter bias unit adapted to adjust the second control voltage according to the first control voltage and the second control current which is input to the LF.

In one embodiment, the filter bias unit includes a voltage follower, a first PMOS transistor and a second PMOS transistor connected in parallel, and a first current source. One input of the voltage follower is a first control voltage, and the other input is connected with an output of the voltage follower and sources of the first PMOS transistor and the second PMOS transistor. Gate voltage and drain voltage of the first PMOS transistor and the second PMOS transistor are a second control voltage, and drain-source currents of the first PMOS transistor and the second PMOS transistor are provided by the first current source, the current provided by the first current source being the second control current output from a bias current converter.

The filter unit further includes a capacitor and a second current source, a resistor of the filter unit includes a third PMOS transistor and a fourth PMOS transistor connected in parallel, and the capacitor includes a first capacitor and a second capacitor. One terminal of the first capacitor is connected with drains of a third PMOS transistor and a fourth PMOS transistor. One terminal of the second capacitor is connected with sources of the third PMOS transistor and the fourth PMOS transistor, and the other terminal of the second capacitor is connected with the other terminal of the first capacitor and a first voltage. Source voltages of the third PMOS transistor and the fourth PMOS are the first control voltage and gate voltages of the third PMOS transistor and the fourth PMOS are the second control voltage. The second current source is connected with the two terminals of the second capacitor, and a current of the second current source is a charging or discharging current output from the CP.

Optionally, the oscillation unit with symmetric loads includes at least two differential buffer delay stages connected in series with symmetric loads. A positive input of a subsequent differential buffer delay stage is connected with a negative output of a previous differential buffer delay stage, and a negative input of a subsequent differential buffer delay stage is connected with a positive output of the previous differential buffer delay stage. A positive input of a first differential buffer delay stage is connected with a positive output of the last differential buffer delay stage, and a negative input of the first differential buffer delay stage is connected with a negative output of the last differential buffer delay stage. The VCO further includes a voltage controlled oscillation bias unit adapted to generate a bias current and a bias voltage which is provided to the oscillation unit according to the first control voltage.

In one embodiment, a differential buffer delay stage with symmetric loads includes a first symmetric load consisting of a first NMOS transistor and a second NMOS transistor, a second symmetric load consisting of a third NMOS transistor and a fourth NMOS transistor, a fifth PMOS transistor, a sixth PMOS transistor and a seventh PMOS transistor. A gate and a source of the first NMOS transistor are connected with a drain of the second NMOS transistor and a drain of the fifth PMOS transistor; a source of the fifth PMOS transistor is connected with a drain of the seventh PMOS transistor; the third NMOS transistor, the fourth NMOS transistor and the sixth PMOS transistor are structured symmetrically with the second NMOS transistor, the first NMOS transistor and the fifth PMOS transistor; gate voltages of the second NMOS transistor and the third NMOS transistor are a first control voltage; a gate voltage of the seventh PMOS transistor is a bias voltage; source voltages of the first NMOS transistor, the second NMOS transistor, the third NMOS transistor and the fourth NMOS transistor are a first voltage, and a source voltage of the seventh PMOS transistor is a second voltage; a gate of the fifth PMOS transistor is a positive input, and a gate of the sixth PMOS transistor MP6 is a negative input; a drain of the fifth PMOS transistor, a gate and a drain of the first NMOS transistor and a drain of the second NMOS transistor are a negative input, and a drain of the sixth PMOS transistor, a gate and a drain of the fourth NMOS transistor and a drain of the third NMOS transistor are a positive input.

The voltage controlled oscillation bias unit includes a fifth NMOS transistor and a sixth NMOS transistor connected in parallel, an eighth PMOS transistor and a ninth PMOS transistor. A drain of the fifth NMOS transistor is connected with a drain of the sixth NMOS transistor and a drain of the eighth PMOS transistor; a source of the eighth PMOS transistor is connected with a drain and a gate of the ninth PMOS transistor MP9; source voltages of the fifth NMOS transistor and the sixth NMOS transistor and a gate voltage of the eighth PMOS transistor are the first voltage; a source voltage of the ninth PMOS transistor MP9 is the second voltage; gate voltages of the fifth NMOS transistor and the sixth NMOS transistor is the first control voltage; a gate voltage and a drain voltage of the ninth PMOS transistor are the bias voltage; and drain-source currents of the fifth NMOS transistor and the sixth NMOS transistor are the bias current.

Optionally, the bias current converter includes a first current mirror adapted to be input the bias current and output the first control current which x times the input current, wherein x is a constant; and a second current mirror adapted to be input the bias current and output the second control current which N times the input current, wherein N is a frequency division factor of the divider.

In order to address the above problem, the present invention further provide a phase locking method including:

detecting a frequency difference and a phase difference between an input signal and a feedback signal generated by frequency division of an output signal, and generating a pulse control signal;

generating a charging or discharging current which equals to a first control current according to the pulse control signal;

boosting a first control voltage at two terminals of a filter unit when the charging current is generated, and lowering the first control voltage when the discharging current is generated, wherein the filter unit includes a resistor controlled by the first control voltage and a second control voltage, and the second control voltage is adjusted according to the first control voltage and a second control current; and increasing an oscillation frequency of the output signal when the first control voltage is boosted, and decreasing the oscillation frequency of the output signal when the first control voltage is lowered, wherein the oscillation frequency of the output signal is an oscillation frequency of an oscillation unit with symmetric loads controlled by the first control voltage, and a bias voltage of the oscillation unit is generated according to the first control voltage;

wherein the first control current equals to the ratio of a bias current to a constant; the second control current equals to the ratio of the bias current to a frequency division factor; and the bias current is generated according to the first control voltage.

As compared with the prior art, the above technical solutions control the oscillation frequency of the VCO and the bias current output from the VCO according to the first control voltage, and convert the bias current generated by the VCO into the first control current input to the CP and the second control current input to the LF through the bias current converter. Charging or discharging for the resistor and the capacitor of the LF is controlled by the first control current to change the first control voltage, and the second control voltage is adjusted by the first control voltage in combination with the second control current to control the resistor of the LF. Therefore, the above technical solutions require only one CP to enable the self-biased PLL to satisfy the requirement for keeping a fixed value of the loop damping factor, thereby simplifying the circuit structure of the self-biased PLL as compared with two CPs required in the prior art and also optimizing the loop bandwidth. Furthermore, the above technical solutions also dispense with the bias generator circuit in the prior art and thus further simplify the circuit of the self-biased PLL.

DETAILED DESCRIPTION OF THE INVENTION

In embodiments of the present invention, a relationship between a resistor of a Loop Filter (LF) (that is, $R_p$ in Equation (1)) and a frequency division factor of a divider and a bias current output from a Voltage Control Oscillator (VCO) and a relationship between a charging or discharging current output from a Charge Pump (CP) (that is $I_p$ in Equation (1)) and the bias current output from the VCO are created to eliminate the frequency division factor and the bias current so as to satisfy a requirement for keeping a fixed value of a loop damping factor of a self-biased Phase Locked Loop (PLL).

Figure 1:
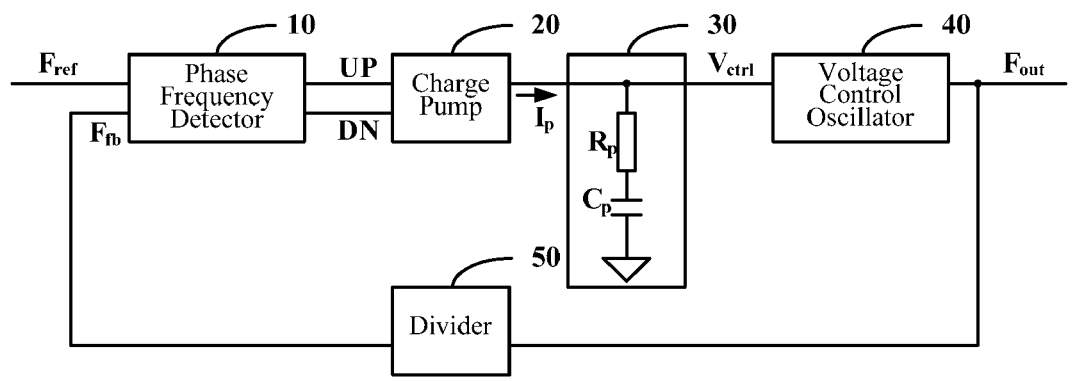
FIG. 1 is a schematic diagram of a basic structure of a PLL.
Figure 2:
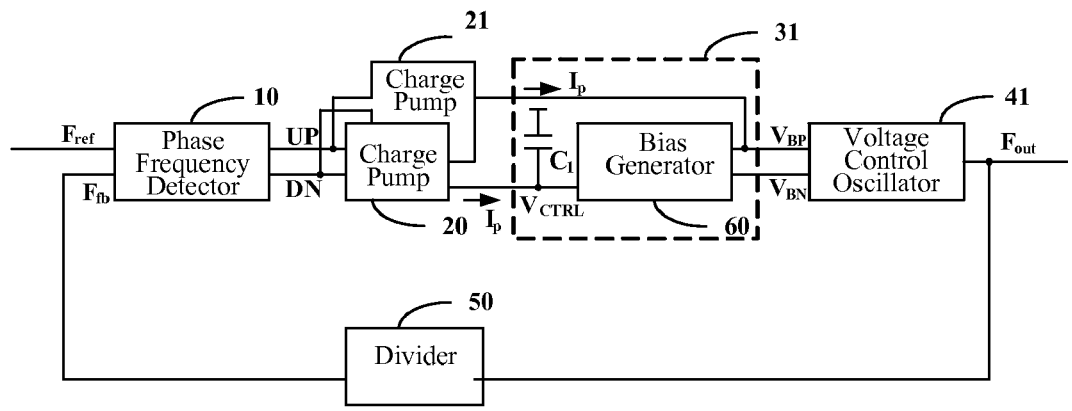
FIG. 2 is a schematic diagram of a basic structure of a self-biased PLL.
Figure 3:
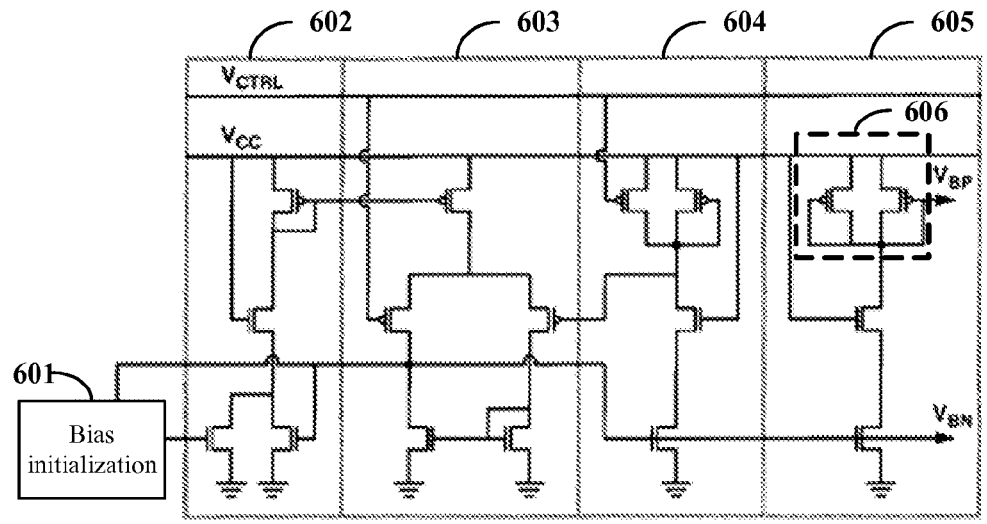
FIG. 3 is a circuit diagram of a self-biased generator of the self-biased PLL illustrated in FIG. 2.
Figure 4:
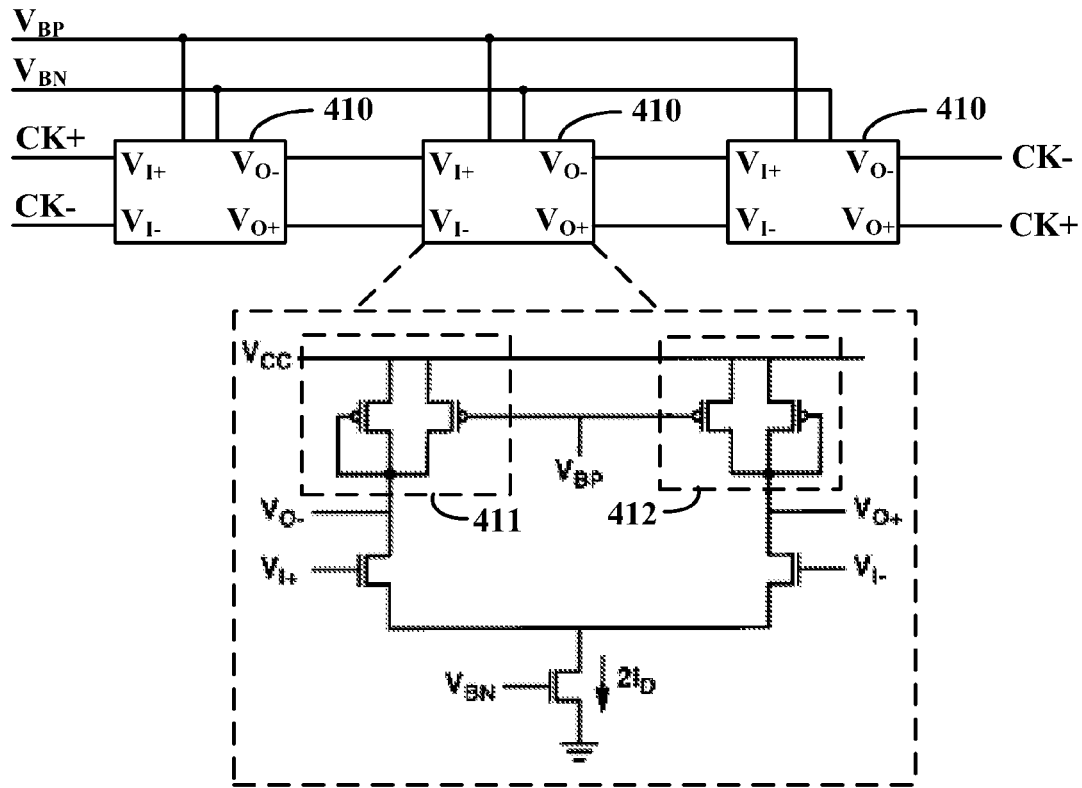
FIG. 4 is a circuit diagram of a VCO of the self-biased PLL illustrated in FIG. 2.
Figure 5:
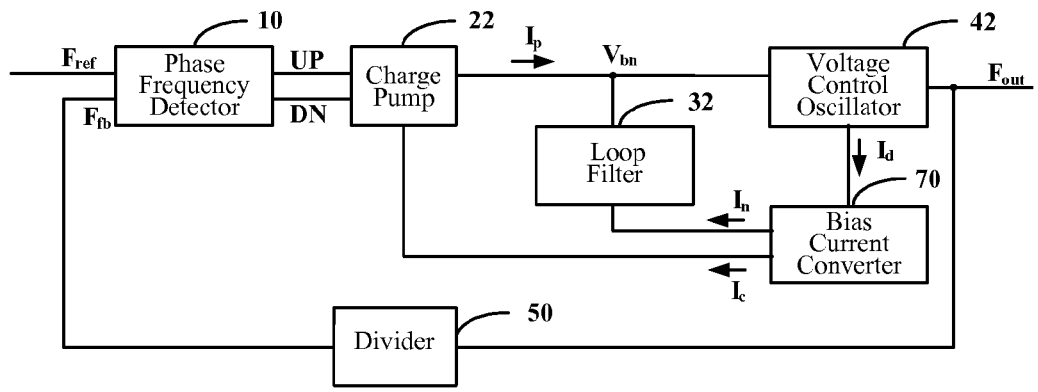
FIG. 5 is a schematic diagram of a basic structure of a self-biased PLL according to an embodiment of the present invention.

The embodiments of the present invention will be described in detail below with reference to the drawings. FIG. 5 is a schematic diagram of a basic structure of a self-biased PLL according to an embodiment of the present invention, and the self-biased PLL includes a Phase Frequency Detector (PFD) 10, a CP 22, a LF 32, a VCO 42, a bias current converter 70 and a divider 50.

The PFD 10 detects a frequency difference and a phase difference between an input signal $F_{ref}$ and a feedback signal $F_{fb}$ and generates pulse control signals UP and DN. For example. When a phase of the feedback signal $F_{fb}$ lags behind that of the input signal $F_{ref}$, a pulse width of the pulse control signal UP is larger than that of the pulse control signal DN. When the phase of the feedback signal $F_{fb}$ leads over that of the input signal $F_{ref}$, the pulse width of the pulse control signal UP is smaller than that of the pulse control signal DN. A circuit of the PFD 10 is well known to those skilled in the art and will not be further described here.

The CP 22 generates a charging or discharging current $I_p$ according to the pulse control signals UP and DN output from the PFD 10. When the phase of the feedback signal $F_{fb}$ lags behind that of the input signal $F_{ref}$, the pulse width of the pulse control signal UP is larger than that of the pulse control signal DN and the CP 22 outputs the charging current $I_p$. When the phase of the feedback signal $F_{fb}$ leads over that of the input signal $F_{ref}$, the pulse width of the pulse control signal UP is smaller than that of the pulse control signal DN and the CP 22 outputs the discharging current $I_p$. The charging current or discharging current $I_p$ equals to a first control current $I_c$ input to the CP 22.

Figure 6:
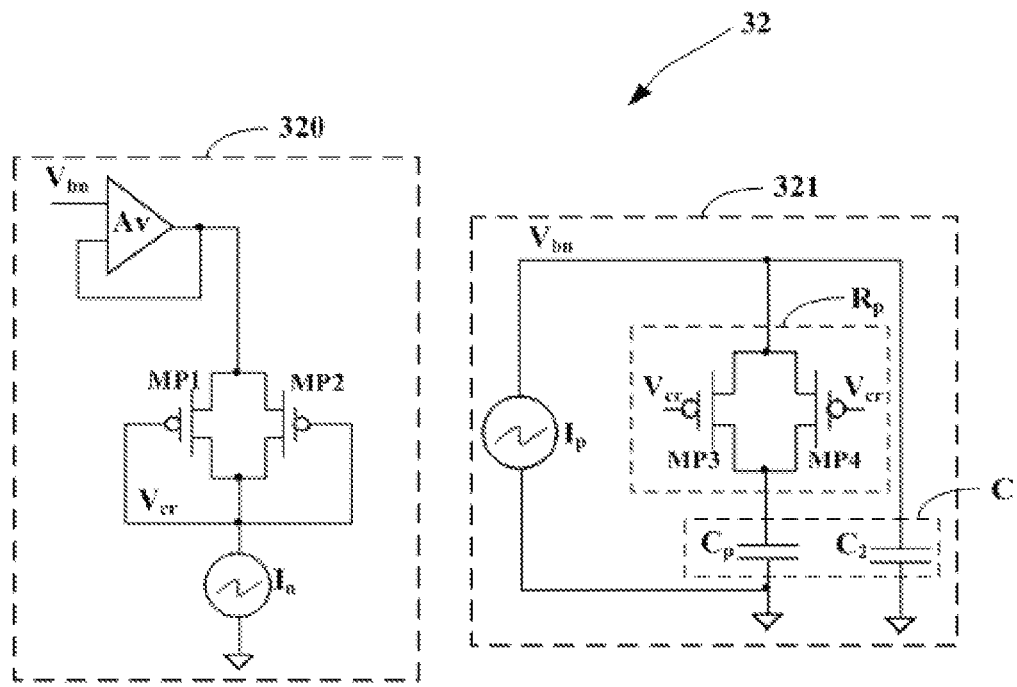
FIG. 6 is a circuit diagram of an embodiment of a LF of the self-biased PLL illustrated in FIG. 5.

The LF 32 connected with the CP 22 outputs a first control voltage $V_{bn}$, and includes a filter unit which is charged when the CP 22 outputs the charging current $I_p$ to boost the first control voltage $V_{bn}$ at two terminals of the filter unit and which is discharged when the CP 22 outputs the discharging current $I_p$ to drop the first control voltage $V_{bn}$ at the two terminals of the filter unit. Furthermore, the filter unit includes a resistor controlled by the first control voltage $V_{bn}$ and a second control voltage, wherein the second control voltage is adjusted according to the first control voltage $V_{bn}$ and a second control current $I_n$ which is input to the LF 32. A specific circuit of the LF 32 as illustrated in FIG. 6 will be described in detail later.

Figure 7:
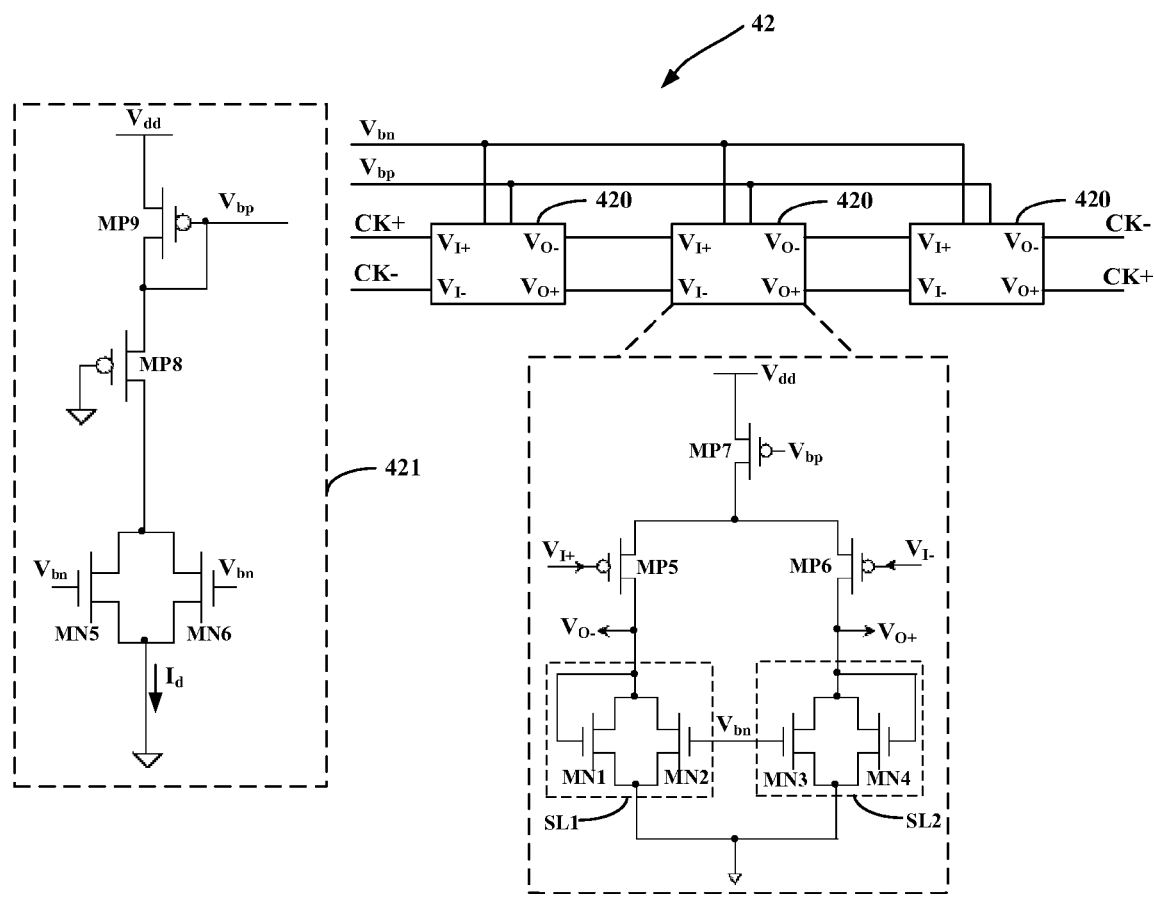
FIG. 7 is a circuit diagram of an embodiment of a VCO of the self-biased PLL illustrated in FIG. 5.

The VCO 42 includes an oscillation unit with symmetric loads controlled by the first control voltage $V_{bn}$ to increase an oscillation frequency of an output signal $F_{out}$ when the first control voltage $V_{bn}$ is boosted and to decrease the oscillation frequency of the output signal $F_{out}$ when the first control voltage $V_{bn}$ is dropped. Furthermore, the VCO 42 generates a bias current Id and a bias voltage which is provided to the oscillation unit according to the first control voltage $V_{bn}$ output from the LF 32. A specific circuit of the VCO 42 as illustrated in FIG. 7 will be described in detail later.

The output signal $F_{out}$ of the VCO 42 generates a feedback signal $F_{fb}$ through the divider 50, that is, $F_{fb}=F_{out}/N$, where N denotes a frequency division factor of the divider 50. The entire system forms a feedback system, and the frequency and phase of the output signal $F_{out}$ are locked to a fixed frequency and phase.

The bias current converter 70 converts the bias current $I_d$ generated by the VCO 42 into the first control current $I_c$ provided to the CP 22 and the second control current $I_n$ provided to the LF 32. The first control current $I_c$ equals to the ratio of the bias current $I_d$ to a constant x, and the second control current $I_n$ equals to the ratio of the bias current $I_d$ to the frequency division factor N of the divider, that is:

$$I_c = \frac{I_d}{x} = I_p \quad (5)$$

$$I_n = \frac{I_d}{N} \quad (6)$$

Equations (5) and (6) indicate that the first control current $I_c$ and the second control current $I_n$ are positively proportional to the bias current $I_d$ output from the VCO 42, which can be implemented by a current mirror with an output current and an input current in a multiple relationship. A specific circuit structure of the current mirror is well known to those skilled in the art and therefore will not be further described here. The bias current converter 70 includes a first current mirror and a second current mirror (not shown). The first current mirror to which the bias current $I_d$ is input outputs the first control current $I_c$ which x times the input current, and the second current mirror to which the bias current $I_d$ is input outputs the second control current $I_n$ which N times the input current.

FIG. 6 is a specific circuit for implementing the LF 32 illustrated in FIG. 5. As shown in FIG. 6, the LF 32 includes a filter bias unit 320 and a filter unit 321. The filter bias unit 320 adjusts a second control voltage $V_{cr}$ according to a first control voltage $V_{bn}$ and a second control current $I_n$ which is input to the LF 32. The filter unit 321 includes a capacitor C and a resistor $R_p$ which is controlled by the first control voltage $V_{bn}$ and the second control voltage $V_{cr}$. The resistor $R_p$ and the capacitor C are charged when a CP 22 outputs a charging current $I_p$ to boost the first control voltage $V_{bn}$ and are discharged when the CP 22 outputs a discharging current $I_p$ to drop the first control voltage $V_{bn}$.

The filter bias unit 320 includes a voltage follower Av, a first PMOS transistor MP1 and a second PMOS transistor MP2 connected in parallel, and a first current source $I_n$. The voltage follower Av is an operation amplifier. One input of the operation amplifier is the first control voltage $V_{bn}$, and the other input of the operation amplifier Av is connected with an output terminal thereof, that is, an output voltage of the operation amplifier Av equals to (or follows) the input first control voltage $V_{bn}$, and the voltage follower Av functions to drive the first PMOS transistor MP1 and the second PMOS transistor MP2. A source of the first PMOS transistor MP1 is connected with and a source of the second PMOS transistor MP2 and is connected to the output terminal of the voltage follower Av. A gate and a drain of the first PMOS transistor MP1 are connected with a gate and a drain of the second PMOS transistor MP2 and are connected to the first current source $I_n$. A current of the first current source $I_n$ provided by the second control current $I_n$ output from the bias current converter 70. Therefore, it can be concluded in combination with Equation 6 that drain-source currents of the first PMOS transistor MP1 and the second PMOS transistor MP2 will satisfy $I_{ds2}=I_n=I_d/N$.

Source voltages of the first PMOS transistor MP1 and the second PMOS transistor MP2 are the first control voltage $V_{bn}$ and gate voltages thereof is the second control voltage $V_{cr}$, and the first PMOS transistor MP1 and the second PMOS transistor MP2 operate in a saturation region. Therefore, the drain-source currents $I_{ds2}$ of the first PMOS transistor MP1 and the second PMOS transistor MP2 can be expressed in Equation (7):

$$I_{ds2} = I_n = \frac{I_d}{N} = \frac{1}{2}*kp*(V_{gs2}-Vt)^2 \quad (7)$$

where kp denotes a process factor of a PMOS transistor (the same process factor is assumed for all the PMOS transistors in the embodiment to simplify the derivation procedure although process factors of the respective PMOS transistors may be in a constant ratio relationship in practice), Vt denotes a threshold voltage of a PMOS transistor, and $V_{gs2}=V_{bn}-V_{cr}$ is a gate-source voltage of the second PMOS transistor MP2. Therefore, the second control voltage $V_{cr}$ can be adjusted as the first control voltage $V_{bn}$ and the second control current $I_n$ vary.

The filter unit 321 includes a resistor $R_p$ including a third PMOS transistor MP3 and a fourth PMOS transistor MP4 connected in parallel, a capacitor C including a first capacitor $C_p$ and a second capacitor $C_2$, and a second current source $I_p$. A source of the third PMOS transistor MP3 and A source of the fourth PMOS transistor MP4 are connected each other. A drain of the third PMOS transistor MP3 and a drain of the fourth PMOS transistor MP4 are connected with one another and are connected with one terminal of the first capacitor $C_p$. One terminal of the second capacitor $C_2$ is connected with the source of the third PMOS transistor MP3 and the source of the fourth PMOS transistor PM4, and the other terminals of the first capacitor $C_p$ and the second capacitor $C_2$ are connected with a first voltage (typically the ground); and the second current source $I_p$ is connected in parallel with the resistor $R_p$ and the first capacitor $C_p$ connected in series, that is, connected with the two terminals of the second capacitor $C_2$, to provide the resistor $R_p$ and the capacitor C with a discharging current, and a current of the second current source $I_p$ is provided by a charging or discharging current $I_p$ output from the CP 22 (that is, a first control current $I_c$ output from the bias current converter 70).

Source voltages of the third PMOS transistor MP3 and the fourth PMOS transistor PM4 are the first control voltage $V_{bn}$ and gate voltages thereof is the second voltage $V_{cr}$. After the PLL is locked, there is no voltage drop at two terminals of the resistor Rp, that is, $V_{ds3}=V_{ds4}=0$, and the third PMOS transistor MP3 and the fourth PMOS transistor PM4 operate in a linear region. Therefore, drain-source currents $I_{ds3}$ of the third PMOS transistor MP3 and the fourth PMOS transistor PM4 can be expressed in Equation (8):

$$I_{ds3} = \frac{1}{2} * kp * [2(V_{gs3} - Vt) * V_{ds3} - V_{ds3}^2] \quad (8)$$

where kp denotes a process factor of a PMOS transistor, Vt denotes a threshold voltage of the PMOS transistor, and $V_{gs3}=V_{bn}-V_{cr}$ is a gate-source voltage of the third PMOS transistor MP3. A transconductance grds of the third PMOS transistor MP3 and the fourth PMOS transistor MP4 can be derived from Equation (8) and expressed in Equation (9):

$$grds = \frac{\partial I_{ds3}}{\partial V_{ds3}} = kp * \left[(V_{gs3} - Vt) - \frac{1}{2}V_{ds3}\right] \quad (9)$$

Both sides of Equation (7) are multiplied by kp and transformed to derive:

$$kp * (V_{gs2} - Vt) = \sqrt{\frac{2*kp*I_d}{N}} \quad (7\text{-}1)$$

Equation (7-1), $V_{ds3}=0$ and $V_{gs3}=V_{bn}-V_{cr}-V_{gs2}$ are substituted into Equation (9) to derive:

$$grds = kp * (V_{gs3} - Vt) = \sqrt{\frac{2*kp*I_d}{N}} \quad (9\text{-}1)$$

Therefore, the resistor $R_p$ of the filter unit 321 can be expressed in Equation (10):

$$R_p = 1/grds = \sqrt{\frac{N}{2*kp*I_d}} \quad (10)$$

FIG. 7 is a specific circuit for implementing the VCO 42 illustrated in FIG. 5. As shown in FIG. 7, the VCO 42 includes an oscillation unit with symmetric loads (not shown) and a voltage controlled oscillation bias unit 421. The oscillation unit with symmetric loads may include n (n≧2) differential buffer delay stages 420 connected in series with symmetric loads. The oscillation unit illustrated in FIG. 7 includes three differential buffer delay stages 420 with symmetric loads, wherein a positive input $V_{I+}$ of a subsequent differential buffer delay stage 420 is connected with a negative output $V_{O-}$ of a previous differential buffer delay stage 420, and a negative input $V_{I-}$ of the subsequent differential buffer delay stage 420 is connected with a positive output $V_{O+}$ of the previous differential buffer delay stage 420; and a positive input $V_{I+}$ of the first differential buffer delay stage 420 is connected with a positive output $V_{O+}$ of the last differential buffer delay stage 420, and a negative input $V_{I-}$ of first differential buffer delay stage 420 is connected with a negative output $V_{O-}$ of the last differential buffer delay stage 420.

An oscillation frequency of the oscillation unit with symmetric loads, that is, the frequency of an output signal $F_{out}$, is increased when a first control voltage $V_{bn}$ is boosted, and the oscillation frequency of the oscillation unit is decreased when the first control voltage $V_{bn}$ is lowered. In other words, the oscillation frequency of the differential buffer delay stages 420 with symmetric loads is controlled by the first control voltage $V_{bn}$, and the oscillation frequency is increased when the first control voltage $V_{bn}$ is boosted, and the oscillation frequency is decreased when the first control voltage $V_{bn}$ is lowered. A differential buffer delay stages 420 includes a first symmetric load SL1 including a first NMOS transistor MN1 and a second NMOS transistor MN2, a second symmetric load SL2 including a third NMOS transistor MN3 and a fourth NMOS transistor MN4, a fifth PMOS transistor MP5, a sixth PMOS transistor MP6 and a seventh PMOS transistor MP7. A source of the first NMOS transistor MN1 and a source of the second NMOS transistor MN2 of the first symmetric load SL1 are connected with each other, and the source voltage is a first voltage; a gate and a drain of the first NMOS transistor MN1 is connected with a drain of the second NMOS transistor MN2 and a drain of the fifth PMOS transistor MP5; a source of the fifth PMOS transistor MP5 and a drain of the seventh PMOS transistor MP7 are connected with each other; and a source voltage of the seventh PMOS transistor MP7 is a second voltage (typically a supply voltage, for example, 1.2V). Since circuits at the left and right sides of the differential buffer delay stage 420 are completely symmetric, the third NMOS transistor MN3, the fourth NMOS transistor MN4 and the sixth PMOS transistor MP6 are connected in the same way as the second NMOS transistor MN2, the first NMOS transistor MN1 and the fifth PMOS transistor MP5.

A gate of the fifth PMOS transistor MP5 is a positive input $V_{I+}$, and a drain of the fifth PMOS transistor MP5 is a negative output $V_{O-}$; a gate of the sixth PMOS transistor MP6 is a negative input $V_{I-}$, and the drain of the sixth PMOS transistor MP6 is a positive output $V_{O+}$; and a gate voltage of the second NMOS transistor MN2 and the third NMOS transistor MN3 is the first control voltage $V_{bn}$, and a gate voltage of the seventh PMOS transistor MP7 is a bias voltage $V_{bp}$ which is generated by the voltage controlled oscillation bias unit 421 according to the first control voltage $V_{bn}$. Resistances of the first symmetric load SL1 and the second symmetric load SL2, time delays of the buffer delay stage 420 and the frequency of the output signal $F_{out}$ of the VCO 42 (CK+ or CK1) vary with the first control voltage $V_{bn}$.

The voltage controlled oscillation bias unit 421 generates a bias current Id and the bias voltage $V_{bp}$ which is provided to the differential buffer delay stage 420 of the oscillation unit with symmetric loads according to the first control voltage $V_{bn}$. The voltage controlled oscillation bias unit 421 includes a fifth NMOS transistor MN5 and a sixth NMOS transistor MN6 connected in parallel, an eighth PMOS transistor MP8 and a ninth PMOS transistor MP9. A source of the fifth NMOS transistor MN5 is connected with a source of the sixth NMOS transistor MN6; a drain of the fifth NMOS transistor MN5 is connected with a drain of the sixth NMOS transistor MN6 and a drain of the eighth PMOS transistor MP8; and a source of the eighth PMOS transistor MP8 is connected with a drain and a gate of the ninth PMOS transistor MP9.

Source voltages of the fifth NMOS transistor MN5 and the sixth NMOS transistor MN6 and a gate voltage of the eighth PMOS transistor MP8 are the first voltage, a source voltage of the ninth PMOS transistor MP9 is the second voltage, gate voltages of the fifth NMOS transistor MN5 and the sixth NMOS transistor MN6 are the first control voltage $V_{bn}$, and a gate voltage of the ninth PMOS transistor MP9 is the bias voltage $V_{bp}$. In other words, the source of the eighth PMOS transistor MP8 and the gate and the drain of the ninth PMOS transistor MP9 are connected with the gates of the seventh PMOS transistors MP7 of the differential buffer delay stages 420, and the first control voltage $V_{bn}$ results in the bias voltage $V_{bp}$ by the fifth NMOS transistor MN5, the sixth NMOS transistor MN6, the eighth PMOS transistor MP8 and the ninth PMOS transistor MP9.

The first control voltage $V_{bn}$ results in the bias current $I_d$ by the fifth NMOS transistor MN5 and the sixth NMOS transistor MN6, that is, drain-source currents $I_{ds5}$ of the fifth NMOS transistor MN5 and the sixth NMOS transistor MN6, and the fifth NMOS transistor MN5 and the sixth NMOS transistor MN6 operate in a saturation region. Therefore, the drain-source current $I_{ds}$, that is, the bias current $I_d$, can be expressed in Equation (11):

$$I_d = I_{ds5} = \frac{1}{2} * kn * (V_{gs5} - Vt)^2 \tag{11}$$

where kn denotes a process factor of an NMOS transistor (similarly, the same process factor is assumed for all the NMOS transistors in the embodiment to simplify the derivation procedure although process factors of the respective NMOS transistors may be in a constant ratio relationship in practice), Vt denotes a threshold voltage of the NMOS transistor, and $V_{gs5} = V_{bn}$ denotes a gate-source voltage of the fifth NMOS transistor MN5.

The oscillation frequency of the VCO 42 (the oscillation frequency of the oscillation unit) $w_v$ can be expressed in Equation (12):

$$\omega_V = \frac{g_m}{C_b} \tag{12}$$

$$= \frac{\sqrt{2kn * I_d}}{C_b}$$

$$= \frac{\sqrt{2kn * \frac{1}{2} * kn * (V_{gs5} - Vt)^2}}{C_b}$$

$$= \frac{kn * (V_{gs5} - Vt)}{C_b}$$

where kn denotes a process factor of an NMOS transistor, Vt denotes a threshold voltage of the NMOS transistor, $V_{gs5}$ denotes the gate-source voltage of the fifth NMOS transistor MN5, and $C_b$ denotes a parasitic capacitor of the VCO. A gain $K_v$ of the VCO 42 can be derived from Equation (12):

$$K_v = \frac{\partial F_V}{\partial V_{gs5}} = \frac{\partial (\omega_V / 2\pi)}{\partial V_{gs5}} = \frac{kn}{2\pi * C_b} \tag{13}$$

Equations (5), (10) and (13) are substituted into Equation (1) to derive the loop damping factor $\xi$:

$$\xi = \frac{R_p}{2} \sqrt{\frac{I_p K_v C_p}{N}} \tag{14}$$

$$= \frac{1}{2} \sqrt{\frac{N}{2 * kp * I_d} * \frac{I_d}{x} * \frac{kn}{2\pi * C_b} * \frac{C_p}{N}}$$

$$= \frac{1}{4} \sqrt{\frac{C_p}{\pi * x * C_b} * \frac{kn}{kp}}$$

where $$\frac{kn}{kp} = \frac{\mu_n * \left(\frac{W}{L}\right)_n}{\mu_p * \left(\frac{W}{L}\right)_p} = y * \frac{\mu_n}{\mu_p};$$

$\mu_n$ denotes a carrier mobility of an NMOS transistor, and $\mu_p$ denotes a carrier mobility of a PMOS transistor; the ratio of a carrier mobility of the NMOS transistor to a carrier mobility of the PMOS transistor is a constant in the same fabrication process, for example, 2 in the embodiment, that is, $\mu_n/\mu_p = 2$; and y is defined as the ratio of an aspect ratio $(W/L)_n$ of the NMOS transistor to an aspect ratio $(W/L)_p$ of the PMOS transistor, that is, $$y = \left(\frac{W}{L}\right)_n / \left(\frac{W}{L}\right)_p.$$

Therefore, the loop damping factor $\xi$ in Equation (14) can be simplified:

$$\xi = \sqrt{\frac{y * C_p}{8\pi * x * C_b}} \tag{15}$$

As apparent from Equation (15), the loop damping factor can be kept as a fixed value by setting the values of the parameters x and y appropriately because the capacitors $C_b$ and $C_p$ are determined during the fabrication process. For example, the loop damping factor $\xi = 1$ and the capacitor $C_p = 112.5$ pF are assumed and the $C_b = 0.112$ pF is derived from a simulation test, so that $$\frac{y}{x} = \frac{8\pi C_b}{C_p} = 0.025$$

can be obtained. If y=1 is assumed, that is, the aspect ratio of the NMOS transistor $(W/L)_n$ equals to the aspect ratio of the PMOS transistor $(W/L)_p$, then x=40, that is, the charging or discharging current $I_p$ output from the CP 22 is one fortieth of the bias current $I_d$ output from the VCO 42. Equations (5) and (13) are substituted into Equation (2) to derive the loop bandwidth $\omega_n$:

$$\omega_n = \sqrt{\frac{K_v I_p}{N C_p}} \quad (16)$$

$$= \sqrt{\frac{kn}{2\pi * C_b} * \frac{I_d}{x} * \frac{1}{N * C_p}}$$

$$= \sqrt{\frac{2kn * I_d}{C_b^2} * \frac{C_b}{4\pi * x * N * C_p}}$$

$$= \sqrt{\frac{2kn * I_d}{C_b}} * \sqrt{\frac{C_b}{4\pi * x * N * C_p}}$$

With reference to Equation (12), $$\omega_V = \frac{\sqrt{2kn * I_d}}{C_b}$$

and $\omega_V = \omega_{ref} * N$ are substituted into Equation (16) to derive:

$$\omega_n = \frac{\sqrt{2kn * I_d}}{C_b} * \sqrt{\frac{C_b}{4\pi * x * N * C_p}} \quad (16\text{-}1)$$

$$= \omega_V * \sqrt{\frac{C_b}{4\pi * x * N * C_p}}$$

$$= \omega_{ref} * N * \sqrt{\frac{C_b}{4\pi * x * N * C_p}}$$

$$= \omega_{ref} * \sqrt{\frac{N * C_b}{4\pi * x * C_p}}$$

Therefore, the ratio of the loop bandwidth $\omega_n$ to the input frequency $\omega_{ref}$ is:

$$\frac{\omega_n}{\omega_{ref}} = \sqrt{\frac{N * C_b}{4\pi * x * C_p}} \quad (17)$$

As apparent from Equation (17), after the capacitors $C_b$ and $C_p$ is determined and the value of the parameter x is set during the fabrication process, the loop bandwidth $\omega_n$ of the PLL can follow the input frequency $\omega_{ref}$ of the PLL, and the ratio of the loop bandwidth $\omega_n$ to the input frequency $\omega_{ref}$ is positively proportional to a square root of the frequency division factor N of the divider 50 (that is, $\sqrt{N}$). For example, the above capacitors $C_p$=112.5 pF and $C_b$=0.112 pF and x=40 are substituted into Equation (17) to derive:

| N | $F_{ref}$(MHz) | $F_n$ (KHz) | $\omega_n/\omega_{ref}$(%) |
|---|---|---|---|
| 8 | 125 | 500 | 0.4 |
| 64 | 23 | 258 | 1.12 |
| 128 | 7.8 | 87.4 | |
| | 11.7 | 184.9 | 1.58 |
| | 3.9 | 61.6 | |
| 254 | 5.9 | 131.6 | 2.23 |
| | 2 | 44.6 | |

As apparent from the above table, a relatively narrow loop bandwidth $\omega_n=2\pi F_n$ can be obtained even if an input frequency $\omega_{ref}=2\pi F_{ref}$ or frequency division factor N is larger, thereby resulting in a relatively low jitter of the self-biased PLL and hence good performance thereof.

In the LF 32 illustrated in FIG. 6, the second control voltage $V_{cr}$ is adjusted by the first control voltage $V_{bn}$ through a PMOS transistor. In the VCO 42 illustrated in FIG. 7, the bias voltage $V_{bp}$ is generated by the first control voltage $V_{bn}$ through an NMOS transistor. The combination of the PMOS transistor and the NMOS transistor can alleviate a pressure on the supply voltage. Therefore, the self-biased PLL can operate more stably with a lower jitter and better performance.

In correspondence with the above self-biased PLL, the present invention further provides a phase locking method including the steps of:

detecting a frequency difference and a phase difference between an input signal and a feedback signal generated by frequency division of an output signal and generating a pulse control signal;

generating a charging or discharging current which equals to a first control current according to the pulse control signal;

boosting a first control voltage at two terminals of a filter unit when the charging current is generated and lowering the first control voltage when a discharging current is generated, wherein the filter unit includes a resistor controlled by the first control voltage and a second control voltage which is adjusted according to the first control voltage and a second control current; and increasing an oscillation frequency of the output signal when the first control voltage is boosted, and decreasing the oscillation frequency of the output signal when the first control voltage is lowered, wherein the oscillation frequency of the output signal is an oscillation frequency of an oscillation unit with symmetric loads which are controlled by the first control voltage, and a bias voltage of the oscillation unit is generated by the first control voltage;

wherein the first control current equals to the ratio of the bias current to a constant, the second control current equals to the ratio of the bias current to a frequency division factor, and the bias current is generated by the first control voltage.

In summary, the above technical solutions control the oscillation frequency of and the bias current output from the VCO by the first control voltage and convert the bias current generated by the VCO into the first control current input to the CP and the second control current input to the LF by the bias current converter, wherein charging and discharging of the resistor and the capacitor of the LF is controlled by the first control current to change the first control voltage, and the second control voltage is adjusted by the first control voltage in combination with the second control current to control the resistor of the LF. Therefore, the above technical solutions require only one CP to enable the self-biased PLL to satisfy the requirement for keeping a fixed value of the loop damping factor, thereby simplifying the circuit structure of the self-biased PLL as compared with two CPs required in the prior art.

Furthermore, the above technical solutions also optimize the loop bandwidth of the PLL so that the loop bandwidth will be neither too narrow in the case of a low input frequency nor too wide in the case of a high input frequency. Therefore, low-frequency noise at the input and high-frequency noise generated by the VCO can be inhibited to the most extent.

In addition, the above technical solutions also dispense with the bias generator circuit in the prior art and thus further simplify the circuit of the self-biased PLL, and the circuits of the LF, the voltage controlled controller and the bias current converter in the above technical solutions are relatively simple and thus it is convenient to implement.

Although the present invention has been disclosed as above with reference to preferred embodiments thereof but will not be limited thereto. Those skilled in the art can modify and vary the embodiments without departing from the spirit and scope of the present invention. Accordingly, the scope of the present invention shall be defined in the appended claims.

What is claimed is:

1. A self-biased Phase Locked Loop, PLL, comprising:
   a Phase Frequency Detector, PFD, adapted to detect a frequency difference and a phase difference between an input signal and a feedback signal and to generate a pulse control signal;
   a Charge Pump, CP, adapted to generate a charging or discharging current which equals to a first control current input to the CP according to the pulse control signal output from the PFD;
   a Loop Filter, LF, comprising a filter unit and adapted to output a first control voltage, to boost the first control voltage at two terminals of the filter unit when the CP outputs the charging current, and to lower the first control voltage at the two terminals of the filter unit when the CP outputs the discharging current, wherein the filter unit comprises a resistor controlled by the first control voltage and a second control voltage, and the second control voltage is adjusted by the first control voltage and a second control current which is input to the LF;
   a Voltage Control Oscillator, VCO, comprising an oscillation unit with symmetric loads which are controlled by the first control voltage, and adapted to increase an oscillation frequency of an output signal when the first control voltage is boosted, to decrease the oscillation frequency of the output signal when the first control voltage is lowered, and to generate a bias current and a bias voltage which is provided to the oscillation unit by the first control voltage output from the LF;
   a divider adapted to divide frequency for the output signal of the VCO and to generate the feedback signal input to the PFD; and
   a bias current converter adapted to convert the bias current generated by the VCO into the first control current input to the CP and the second control current input to the LF, wherein the first control current equals to a ratio of the bias current to a constant, and the second control current equals to a ratio of the bias current to a frequency division factor of the divider wherein the LF further comprises a filter bias unit adapted to adjust the second control voltage by the first control voltage and the second control current which is input to the LF.

2. The self-biased PLL according to claim 1, wherein:
   the filter bias unit comprises a voltage follower, a first PMOS transistor and a second PMOS transistor connected in parallel, and a first current source, wherein one input of the voltage follower is the first control voltage and the other input of the voltage follower is connected with an output of the voltage follower and sources of the first PMOS transistor and the second PMOS transistor; and gate and drain voltages of the first PMOS transistor and the second PMOS transistor are the second control voltage, and drain-source currents of the first PMOS transistor and the second PMOS transistor are provided by the first current source, a current provided by the first current source being the second control current output from the bias current converter; and
   the filter unit further comprises a capacitor and a second current source, and a resistor of the filter unit comprises a third PMOS transistor and a fourth PMOS transistor connected in parallel, and the capacitor comprises a first capacitor and a second capacitor, wherein a terminal of the first capacitor is connected with drains of the third PMOS transistor and the fourth PMOS transistor; a terminal of the second capacitor is connected with sources of the third PMOS transistor and the fourth PMOS transistor, and the other terminal of the second capacitor is connected with the other terminal of the first capacitor and a first voltage; a source voltage of the third PMOS transistor and the fourth PMOS is the first control voltage and gate voltages of the third PMOS transistor and the fourth PMOS are the second control voltage; and the second current source is connected with the two terminals of the second capacitor, and a current of the second current source is the charging or discharging current output from the CP.

3. The self-biased PLL according to claim 1, wherein,
   the oscillation unit with symmetric loads comprises at least two differential buffer delay stages connected in series with symmetric loads, wherein a positive input of a subsequent differential buffer delay stage is connected with a negative output of a previous differential buffer delay stage, and a negative input of the subsequent differential buffer delay stage is connected with a positive output of the previous differential buffer delay stage; a positive input of a first differential buffer delay stage is connected with a positive output of a last differential buffer delay stage and a negative input of the first differential buffer delay stage is connected with a negative output of the last differential buffer delay stage; and
   the VCO further comprises a voltage controlled oscillation bias unit adapted to generate the bias current and the bias voltage which is provided to the oscillation unit according to the first control voltage.

4. The self-biased PLL according to claim 3, wherein,
   the differential buffer delay stage with symmetric loads comprises a first symmetric load comprising a first NMOS transistor and a second NMOS transistor, a second symmetric load comprising a third NMOS transistor and a fourth NMOS transistor, a fifth PMOS transistor, a sixth PMOS transistor and a seventh PMOS transistor, wherein a gate and a source of the first NMOS transistor are connected with a drain of the second NMOS transistor and a drain of the fifth PMOS transistor; a source of the fifth PMOS transistor is connected with a drain of the seventh PMOS transistor; the third NMOS transistor, the fourth NMOS transistor and the sixth PMOS transistor are structured symmetrically with the second NMOS transistor, the first NMOS transistor and the fifih PMOS transistor; gate voltages of the second NMOS transistor and the third NMOS transistor are the first control voltage, a gate voltage of the seventh PMOS transistor is the bias voltage; source voltages of the first NMOS transistor, the second NMOS transistor, the third NMOS transistor and the fourth NMOS transistor is a first voltage, and a source voltage of the seventh PMOS transistor is a second voltage; a gate of the fifth PMOS transistor is a positive input, a gate of the sixth PMOS transistor is a negative input, a drain of the fifth PMOS transistor, a gate and a drain of the first NMOS transistor and a drain of the second NMOS transistor are a negative input, and a drain of the sixth PMOS transistor, a gate and a drain of the fourth NMOS transistor and a drain of the third NMOS transistor are a positive input; and the voltage controlled oscillation bias unit comprises a fifth NMOS transistor and a sixth NMOS transistor connected in parallel, an eighth PMOS transistor and a ninth PMOS transistor, wherein a drain of the fifth NMOS transistor is connected with a drain of the sixth NMOS transistor and a drain of the eighth PMOS transistor; a source of the eighth PMOS transistor is connected with a drain and a gate of the ninth PMOS transistor; source voltages of the fifth NMOS transistor and the sixth NMOS transistor and a gate voltage of the eighth PMOS transistor are the first voltage, and a source voltage of the ninth PMOS transistor is the second voltage; gate voltages of the fifth NMOS transistor and the sixth NMOS transistor are the first control voltage, and gate and drain voltages of the ninth PMOS transistor are the bias voltage; and drain-source currents of the fifth NMOS transistor and the sixth NMOS transistor are the bias current.

5. The self biased PLL according to claim 1, wherein the bias current converter comprises:
a first current mirror to which the bias current is input outputs the first control current which x times the input current, wherein x is a constant; and
a second current mirror to which the bias current is input outputs the second control current which N times the input current, wherein N is a frequency division factor of the divider.

6. A phase locking method, comprising:
detecting a frequency difference and a phase difference between an input signal and a feedback signal generated by frequency division of an output signal and generating a pulse control signal;

generating a charging or discharging current which equals to a first control current according to the pulse control signal;

boosting a first control voltage output from a filter unit when the charging current is generated, and lowering the first control voltage when a discharging current is generated, wherein the filter unit includes a resistor controlled by the first control voltage and a second control voltage, and the second control voltage is adjusted by the first control voltage and a second control current; and increasing an oscillation frequency of the output signal when the first control voltage is boosted, and decreasing the oscillation frequency of the output signal when the first control voltage is lowered, wherein the oscillation frequency of the output signal is an oscillation frequency of an oscillation unit with symmetric loads which is controlled by the first control voltage, and a bias voltage of the oscillation unit is generated according to the first control voltage;

wherein the first control current equals to a ratio of a bias current to a constant, the second control current equals to a ratio of the bias current to a frequency division factor, and the bias current is generated according to the first control voltage.

* * * * *